United States Patent
Sozawa et al.

(10) Patent No.: US 11,885,678 B2
(45) Date of Patent: Jan. 30, 2024

(54) IMAGE PROCESSING DEVICE

(71) Applicant: SEIKO EPSON CORPORATION, Tokyo (JP)

(72) Inventors: Yoshitaka Sozawa, Nagano (JP); Hidekazu Uematsu, Nagano (JP); Toru Matsuyama, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 239 days.

(21) Appl. No.: 17/456,445

(22) Filed: Nov. 24, 2021

(65) Prior Publication Data

US 2022/0170788 A1 Jun. 2, 2022

(30) Foreign Application Priority Data

Nov. 27, 2020 (JP) ................. 2020-197294

(51) Int. Cl.
*G01J 3/02* (2006.01)
*G01J 3/52* (2006.01)
*H01L 25/16* (2023.01)
*H01L 23/498* (2006.01)
*G01J 3/50* (2006.01)

(52) U.S. Cl.
CPC ............ *G01J 3/027* (2013.01); *G01J 3/0264* (2013.01); *G01J 3/0286* (2013.01); *G01J 3/0291* (2013.01); *G01J 3/50* (2013.01); *G01J 3/52* (2013.01); *H01L 23/49838* (2013.01); *H01L 25/167* (2013.01)

(58) Field of Classification Search
None
See application file for complete search history.

(56) References Cited

FOREIGN PATENT DOCUMENTS

JP 2010-081057 A 4/2010
WO WO-2020172161 A1 * 8/2020 ........... G06F 1/1632

* cited by examiner

*Primary Examiner* — James M Hannett
(74) *Attorney, Agent, or Firm* — Global IP Counselors, LLP

(57) ABSTRACT

An image processing device includes a light receiving element, a light emitting element, a battery, a power source circuit electrically coupled to the battery, a wireless communication module, a first substrate provided with the light receiving element, a second substrate provided with the light emitting element, a third substrate provided with the power source circuit, a fourth substrate provided with the wireless communication module, and a casing storing the first substrate, the second substrate, the third substrate, and the fourth substrate, in which the battery is located between the first substrate, the second substrate, and the third substrate, and the fourth substrate.

7 Claims, 10 Drawing Sheets

IMAGE PROCESSING DEVICE

The present application is based on, and claims priority from JP Application Serial Number 2020-197294, filed Nov. 27, 2020, the disclosure of which is hereby incorporated by reference herein in its entirety.

BACKGROUND

1. Technical Field

The present disclosure relates to an image processing device.

2. Related Art

In recent years, image processing devices provided with a battery and capable of being carried and operated independently have become widespread. For example, JP-A-2010-81057 discloses an image processing device including a calibration data setting section that sets, as calibration data, color chart image data in a temperature near to a temperature at the time of imaging a subject among temperatures between a temperature of an imaging device at the time of imaging a color chart before imaging the subject and a temperature of the imaging device at the time of imaging the color chart after imaging the subject, based on a temperature of the imaging device when the imaging device images the subject, temperatures of the imaging device at the time of imaging the color chart before and after imaging the subject, and color chart image data acquired by imaging the color chart before and after imaging the subject; and an image correction section that corrects image data of the subject acquired by imaging the subject by using the calibration data set by the calibration data setting section. According to the image processing device disclosed in JP-A-2010-81057, image data of a subject can be accurately corrected even when imaging conditions and the like vary during imaging.

However, in an image processing device provided with a battery and capable of being carried or operated independently, since various constituents are disposed in a small casing, a sudden temperature change due to heat generation of a light emitting element, a light receiving element, and a power source circuit influences a wireless communication module and thus there is concern that communication stability may be impaired such that there is still room for technical improvement.

SUMMARY

According to an aspect of the present disclosure, there is provided an image processing device including a light receiving element; a light emitting element; a battery; a power source circuit electrically coupled to the battery; a wireless communication module; a first substrate provided with the light receiving element; a second substrate provided with the light emitting element; a third substrate provided with the power source circuit; a fourth substrate provided with the wireless communication module; and a casing storing the first substrate, the second substrate, the third substrate, and the fourth substrate, in which the battery is located between the first substrate, the second substrate, and the third substrate, and the fourth substrate.

DESCRIPTION OF EXEMPLARY EMBODIMENTS

Hereinafter, preferred embodiments of the present disclosure will be described in detail with reference to the drawings. The drawings used are for convenience of description. The embodiments described below do not unreasonably limit the content of the present disclosure described in the claims. Moreover, not all of the configurations described below are essential constituent requirements of the present disclosure.

Hereinafter, in the present embodiment, a color measurement device will be described as an example of an image processing device according to the present disclosure.

1. Outline of Image Processing Device

Figure 1:
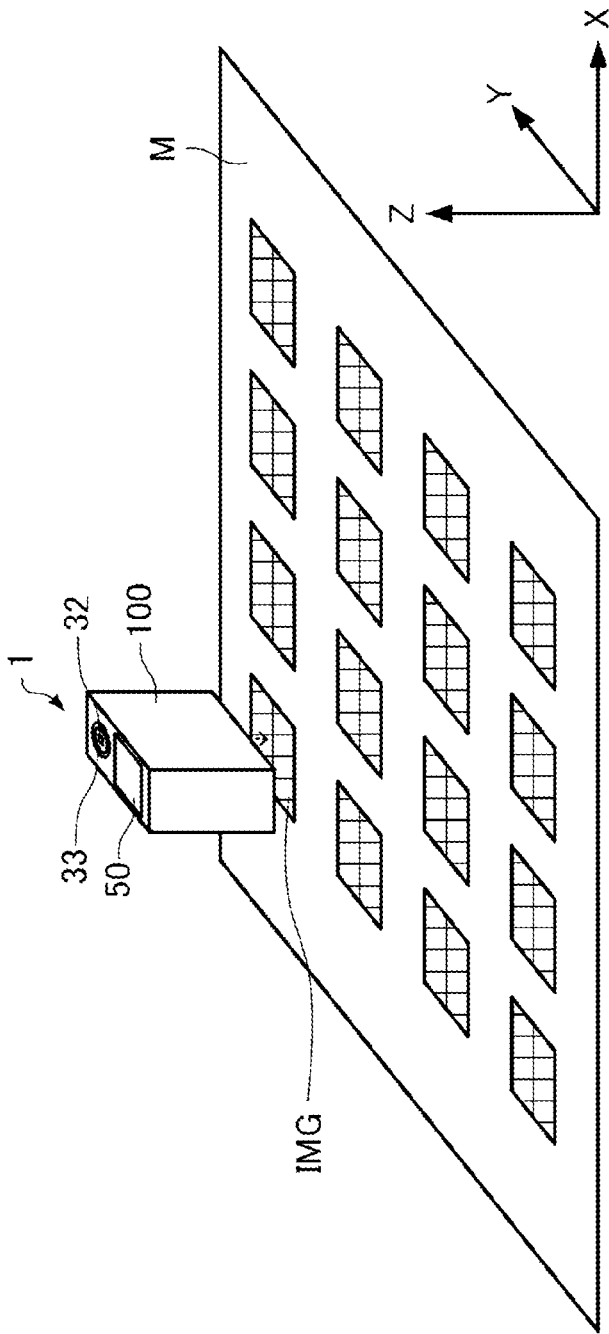
FIG. 1 is a perspective view of an image processing device of the present embodiment.

FIG. 1 is a perspective view of an image processing device 1 of the present embodiment. As illustrated in FIG. 1, the image processing device 1 of the present embodiment performs a color measurement process for measuring a color of an image IMG as image processing. Specifically, when a user moves the image processing device 1 onto an image IMG formed on a medium M and presses an operation section 32 disposed on an upper surface of the image processing device 1, the image processing device 1 emits light from a part of a bottom surface facing the image IMG, and measures a color of the image IMG based on a wavelength of the light reflected at the image IMG. That is, the operation section 32 functions as a measurement start button. For example, the medium M is paper or cloth, and the image IMG is a monochromatic image. As illustrated in FIG. 1, a color chart including a plurality of images having different colors may be formed on the medium M, and the user may move the image processing device 1 onto each image and presses the operation section 32 such that the image processing device 1 measures a color of each image. The image processing device 1 may also measure a color of the medium M.

Figure 2:
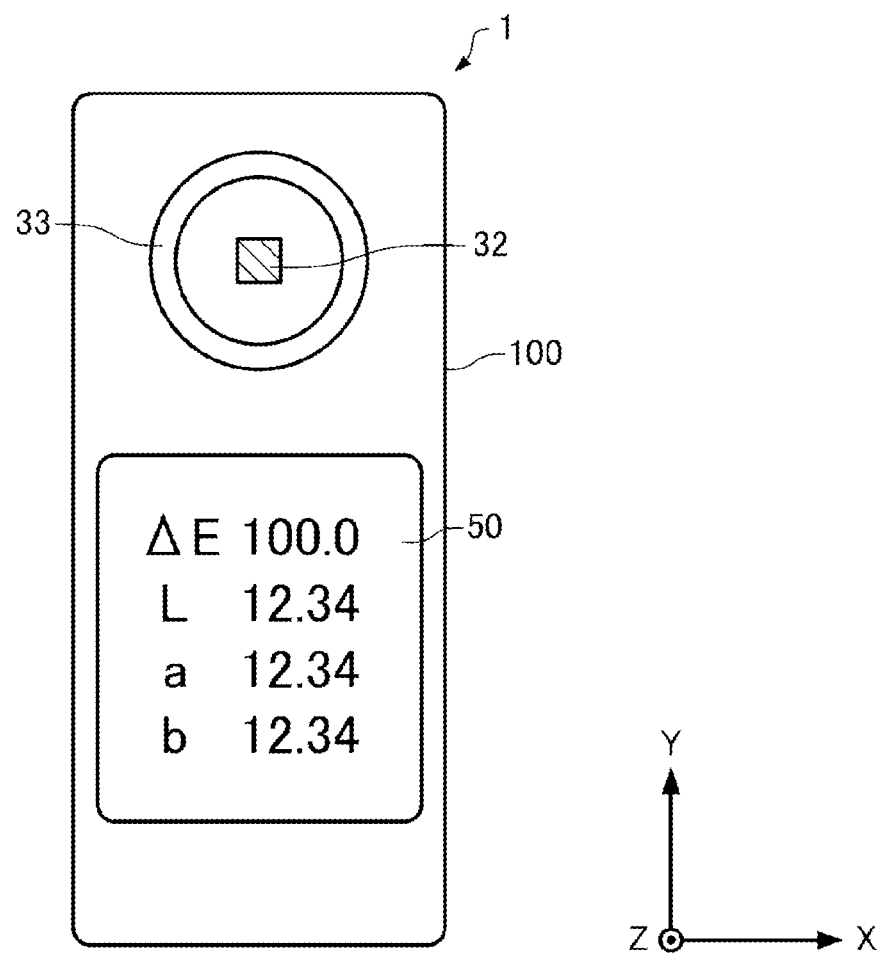
FIG. 2 is a diagram illustrating an example of information displayed on a display module.

The image processing device 1 may calculate a color difference that is a difference between a color measurement value and a target color value. The image processing device 1 displays the calculated color measurement value or color difference on a display module 50 that can be visually recognized by the user from the outside of a casing 100. In the example in FIG. 1, the display module 50 is provided at a position visually recognizable to the user from the surface on which the operation section 32 of the image processing device 1 is disposed. FIG. 2 is a diagram illustrating an example of a color measurement value and a color difference displayed on the display module 50. In the example in FIG. 2, color measurement values L, a, and b and a color difference ΔE displayed on the display module 50 are values in an L*a*b* color space. A color measurement value or a color difference may be a value in various color spaces other than the L*a*b* color space, such as an RGB color space, a YCC color space, a CMYK color space, and an L*C*h color space.

As illustrated in FIGS. 1 and 2, the image processing device 1 may have a light emitting module 33 that can be visually recognized by the user from the outside of the casing 100. In the examples in FIGS. 1 and 2, the light emitting module 33 is disposed to surround the operation section 32. For example, the light emitting module 33 has a tubular light guide and an LED attached to a tip of the light guide, and light emitted by the LED is guided to the light guide. LED stands for light emitting diode. In the examples in FIGS. 1 and 2, the user can visually recognize the light guide of the light emitting module 33. The light emitting module 33 is a status display module, and a light emitting state differs depending on an operation of the user on the operation section 32. For example, the image processing device 1 may cause the light emitting module 33 to emit light when it is recognized that the operation section 32 has been pressed by the user.

The image processing device 1 has a shape similar to a rectangular parallelepiped having a size that can be grasped and operated by the user with one hand, and can thus be carried. Since the image processing device 1 has a battery 70 built thereinto that will be described later and is operated when the user presses the operation section 32, the image processing device 1 can be operated independently without receiving an instruction from another device. Therefore, the image processing device 1 is highly convenient for the user.

As illustrated in FIGS. 1 and 2, directions along three intersecting sides of the casing 100 of the image processing device 1 are respectively set to an X axis, a Y axis, and a Z axis. It is hereinafter assumed that a relationship between the directions of the image processing device 1 and the X axis, Y axis, and Z axis is the same as in FIGS. 1 and 2 except FIG. 3.

2. Functional Configuration of Image Processing Device

Figure 3:
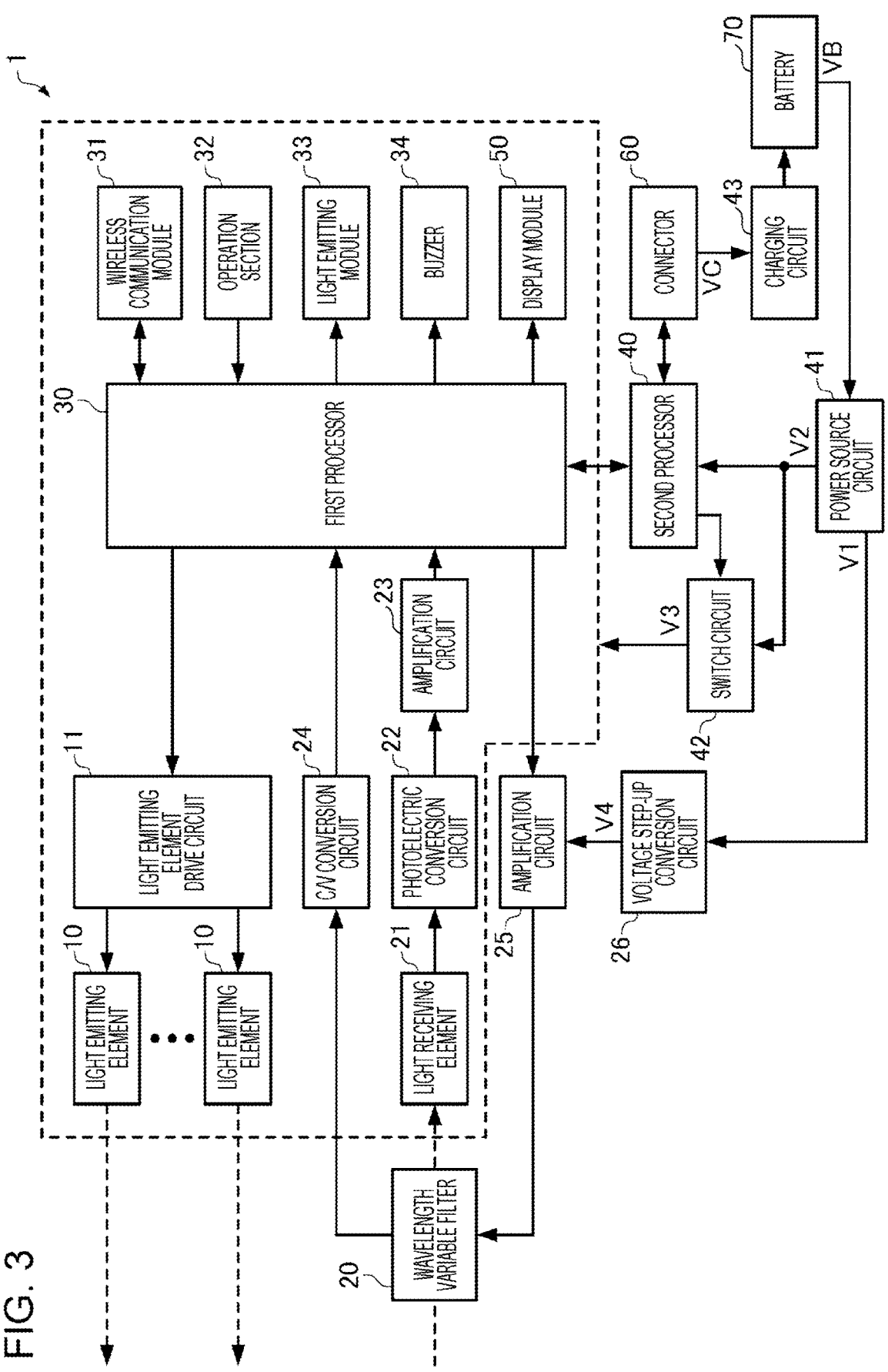
FIG. 3 is a block diagram illustrating a functional configuration of an image processing device.

FIG. 3 is a block diagram illustrating a functional configuration of the image processing device 1. As illustrated in FIG. 3, the image processing device 1 includes a plurality of light emitting elements 10 and a light emitting element drive circuit 11. The image processing device 1 includes a wavelength variable filter 20, a light receiving element 21, a photoelectric conversion circuit 22, an amplification circuit 23, a C/V conversion circuit 24, an amplification circuit 25, and a voltage step-up conversion circuit 26. The image processing device 1 includes a first processor 30, a wireless communication module 31, an operation section 32, a light emitting module 33, a buzzer 34, and a display module 50. The image processing device 1 includes a second processor 40, a power source circuit 41, a switch circuit 42, a charging circuit 43, a connector 60, and a battery 70.

Each of the plurality of light emitting elements 10 is disposed on the bottom surface portion of the image processing device 1, and is turned on or off based on a drive signal output from the light emitting element drive circuit 11. When each light emitting element 10 is turned on, light is emitted from the bottom surface of the image processing device 1. Each light emitting element 10 is, for example, an LED. For example, among the plurality of light emitting elements 10, some light emitting elements may emit white light, and some other light emitting elements may emit ultraviolet light.

The light emitting element drive circuit 11 outputs a plurality of drive signals for respectively driving the plurality of light emitting elements 10 based on control signals from the first processor 30.

The wavelength variable filter 20 transmits light having a wavelength in a predetermined range among light beams incident from the bottom surface of the image processing device 1. The wavelength variable filter 20 includes an electrostatic actuator (not illustrated), and a voltage output from the amplification circuit 25 is applied to the electrostatic actuator. A capacitance value of the electrostatic actuator changes according to the applied voltage, and a wavelength of light transmitted by the wavelength variable filter 20 changes according to the capacitance value of the electrostatic actuator. Therefore, the wavelength of the light transmitted by the wavelength variable filter 20 changes according to the voltage output from the amplification circuit 25. For example, the wavelength variable filter 20 may be an etalon element.

The amplification circuit 25 outputs a voltage of several tens of V for driving the wavelength variable filter 20. The output voltage of the amplification circuit 25 changes based on a control signal from the first processor 30.

The voltage step-up conversion circuit 26 steps up a voltage V1 of several V output from the power source circuit 41 to a voltage V4 of several tens of V and outputs the voltage V4 to the amplification circuit 25. The voltage V4 stepped up by the voltage step-up conversion circuit 26 becomes a power source voltage of the amplification circuit 25. The voltage step-up conversion circuit 26 may be, for example, a step-up DCDC converter.

The C/V conversion circuit 24 converts electric charge stored in the electrostatic actuator into a voltage and outputs the voltage to the first processor 30. The first processor 30 controls an output voltage of the amplification circuit 25 based on a digital value obtained by performing A/D conversion on the output voltage of the C/V conversion circuit 24 such that the wavelength variable filter 20 transmits light having a desired wavelength. That is, a wavelength of light transmitted by the wavelength variable filter 20 is controlled by the first processor 30.

The light receiving element 21 receives the light transmitted through the wavelength variable filter 20 and outputs electric charge having a magnitude corresponding to the amount of light. For example, the light receiving element 21 may be a photodiode.

The photoelectric conversion circuit 22 converts an amount of light received by the light receiving element 21 into an electrical signal and outputs the electrical signal to the amplification circuit 23. For example, the photoelectric conversion circuit 22 may be a C/V conversion circuit that converts electric charge output from the light receiving element 21 into a voltage.

The amplification circuit 23 amplifies the voltage output from the photoelectric conversion circuit 22 and outputs the amplified voltage to the first processor 30.

The first processor 30 is a processor that performs image processing, and generates a digital value indicating an amount of light received by the light receiving element 21 by performing A/D conversion on the output voltage of the photoelectric conversion circuit 22, and stores the amount of light in association with a wavelength of the light. The first processor 30 may be, for example, an MCU or an MPU. MCU stands for micro control unit, and MPU stands for micro-processing unit. The first processor 30 sweeps the wavelength of the light transmitted by the wavelength variable filter 20, and stores the amount of light received by the light receiving element 21 in association with each wavelength. The first processor 30 calculates a color measurement value based on the amount of light associated with each wavelength. When a target color value is known in advance, the first processor 30 calculates a color difference that is the difference between the color measurement value and the target color value.

The wireless communication module 31 has a wireless communication circuit and an antenna (not illustrated). The wireless communication circuit acquires a wireless signal received from an external device via the antenna, demodulates data, and transmits the data to the first processor 30. The wireless communication circuit acquires data from the first processor 30, modulates a high frequency signal, and transmits a wireless signal to the external device via the antenna. For example, the wireless communication module 31 may acquire the color measurement value or the color difference calculated by the first processor 30 and transmit the color measurement value or the color difference to the external device. The wireless communication circuit may have a temperature sensor (not illustrated) and may have a function of performing temperature compensation on the color measurement value based on a signal output from the temperature sensor. The wireless communication module 31 may be, for example, a module transmitting and receiving wireless signals corresponding to wireless communication standards such as Bluetooth (registered trademark) or Wi-Fi.

The operation section 32 outputs an operation signal based on the user's operation to the first processor 30. In the present embodiment, the operation section 32 functions as a measurement start button, and, when the user presses the operation section 32, outputs an operation signal indicating that the operation section 32 is pressed to the first processor 30. The first processor 30 starts a process for color measurement based on the operation signal from the operation section 32.

The light emitting module 33 is a status display module, and emits light based on a control signal from the first processor 30. For example, when the first processor 30 detects that the user has pressed the operation section 32, the first processor 30 outputs a control signal for causing the light emitting module 33 to emit light.

The buzzer 34 notifies the user of various information by generating predetermined sound based on a control signal from the first processor 30. For example, in a case where an optical axis of the light receiving element 21 is shifted or shaken significantly when the user presses the operation section 32 to start measurement, there is concern that normal color measurement may not be possible. Thus, when a failure occurs in the user's operation on operation section 32, the first processor 30 outputs a predetermined control signal to the buzzer 34, and the buzzer 34 emits sound.

The display module 50 displays various information based on a display signal output from the first processor 30. In the present embodiment, the light emitting module 33 includes a display panel illustrated in FIG. 2 and a display driver (not illustrated). The display panel may be, for example, a liquid crystal panel. The display driver generates a drive signal corresponding to a display signal output from the first processor 30 and outputs the drive signal to the display panel. For example, as illustrated in FIG. 2, a color measurement value, a color difference, or the like is displayed on the display panel.

The battery 70 is, for example, a secondary battery such as a lithium ion battery or a lithium polymer battery. When the user presses a power button (not illustrated), the battery 70 outputs a voltage VB according to a remaining capacity thereof.

The power source circuit 41 generates and outputs voltages V1 and V2 based on the output voltage VB of the battery 70. The power source circuit 41 may include a step-up DCDC converter and a step-down DCDC converter (not illustrated), the step-up DCDC converter voltage may step up the output voltage VB of the battery 70 to generate the voltage V1, and the step-down DCDC converter may step down the voltage V1 to generate the voltage V2. The voltage V1 is supplied to the voltage step-up conversion circuit 26, and the voltage V2 is supplied to the second processor 40 as a power source voltage. The voltage V2 is input to the switch circuit 42.

The switch circuit 42 is brought into a conduction state or a non-conduction state according to a control signal from the second processor 40. The switch circuit 42 outputs a voltage V3 that is substantially equal to the voltage V2 in a conduction state. The voltage V3 is supplied as a power source voltage to each circuit surrounded by a dashed line in FIG. 3. When the switch circuit 42 is in a non-conduction state, the voltage V3 is not supplied to each circuit. That is, the second processor 40 is a processor for power source control.

The connector 60 is a connector to which a cable is coupled, and may be, for example, a USB connector. USB stands for Universal Serial Bus. For example, the connector 60 is electrically coupled to an external device such as a personal computer via a USB cable. The second processor 40 may perform data communication with the external device via the connector 60.

The charging circuit 43 charges the battery 70 with a power source voltage VC supplied when the connector 60 is electrically coupled to the external device.

The second processor 40 performs data communication with the first processor 30. The second processor 40 may be started when the voltage V2 is supplied from the power source circuit 41, and may notify the first processor 30 that the second processor 40 has been started. The first processor 30 may notify the second processor 40 that the first processor 30 transitions to a sleep mode after a color measurement process is finished, and the second processor 40 may receive the notification and bring the switch circuit 42 into a non-conduction state such that the supply of the voltage V3 to the first processor 30 is stopped.

3. Structure of Image Processing Device

Next, an internal structure of the image processing device 1 will be described in detail with reference to FIGS. 4 to 15.

Figure 4:
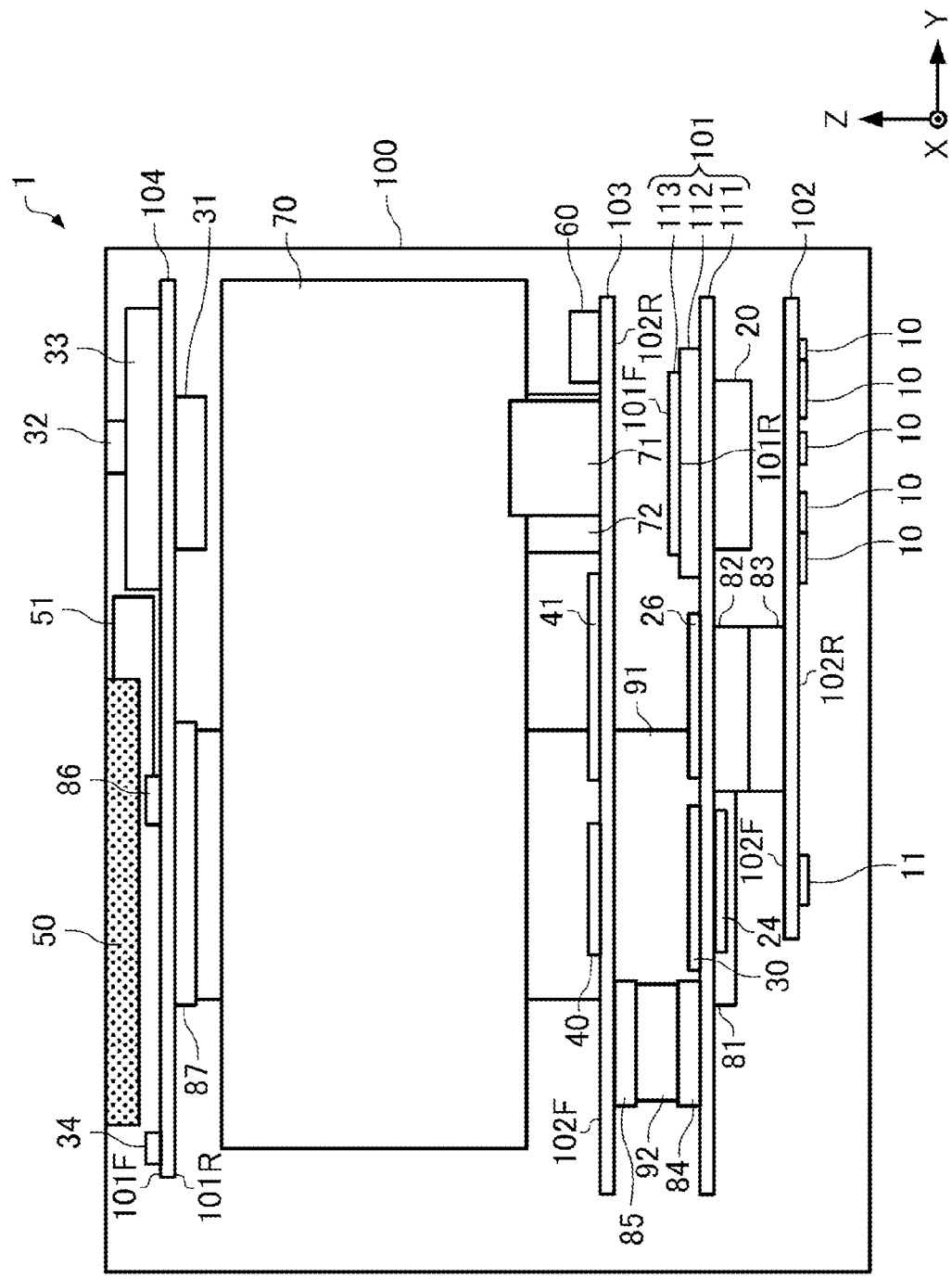
FIG. 4 is a diagram in which the inside of a casing of the image processing device is viewed from a positive direction of an X axis.
Figure 5:
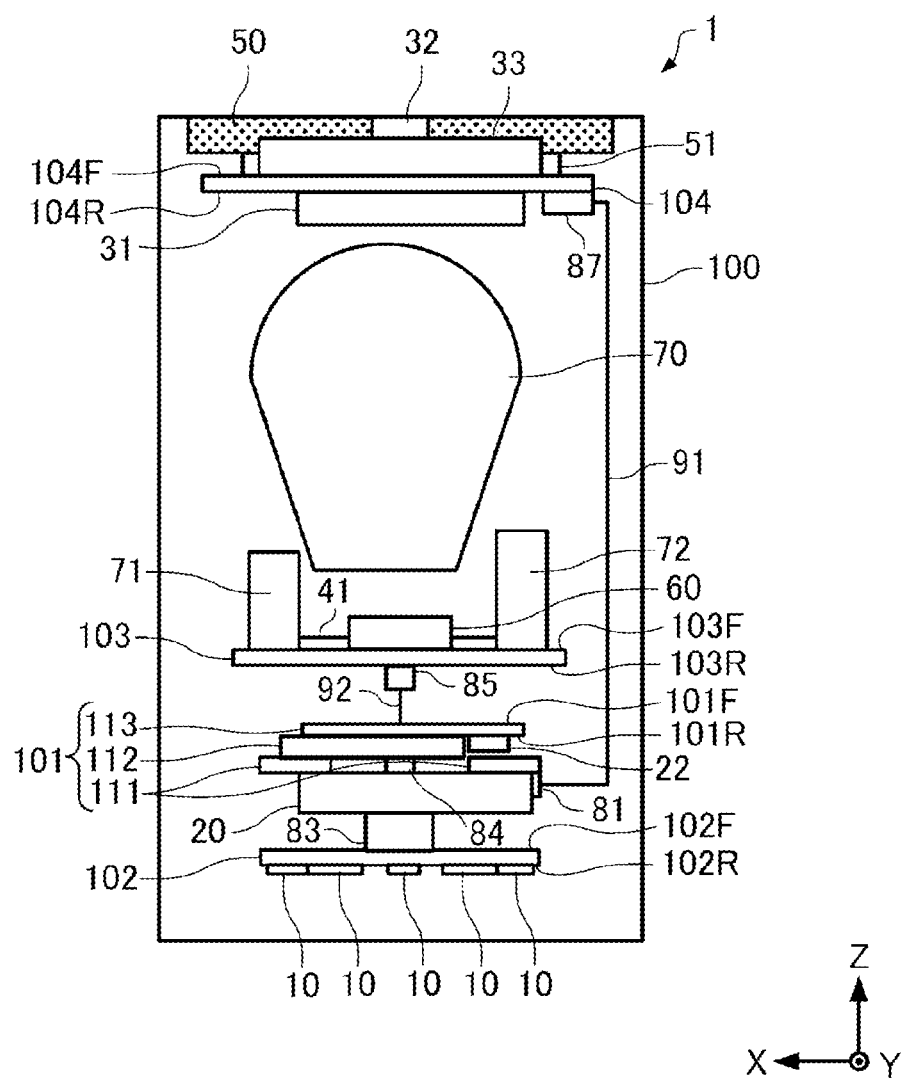
FIG. 5 is a diagram in which the inside of the casing of the image processing device is viewed from a positive direction of a Y axis.
Figure 6:
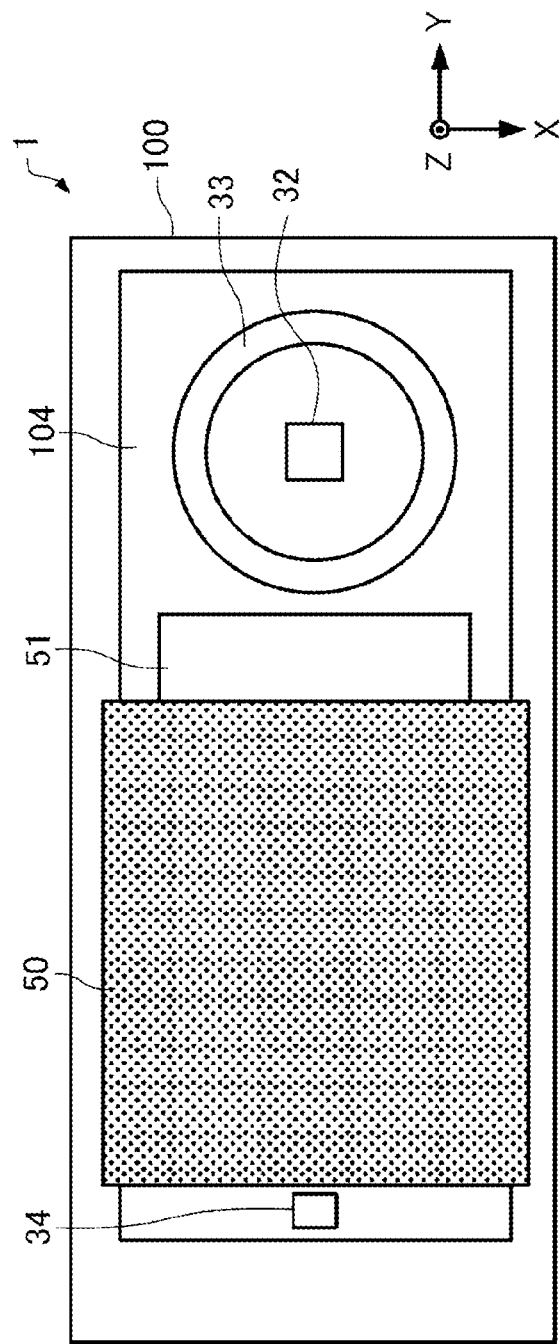
FIG. 6 is a diagram in which the inside of the casing of the image processing device is viewed from a positive direction of a Z axis.

FIG. 4 is a diagram in which the inside of the casing 100 of the image processing device 1 is viewed from the positive direction of the X axis. FIG. 5 is a diagram in which the inside of the casing 100 of the image processing device 1 is viewed from the positive direction of the Y axis. FIG. 6 is a diagram in which the inside of the casing 100 of the image processing device 1 is viewed from the positive direction of the Z axis.

As illustrated in FIGS. 4 and 5, the image processing device 1 has the rectangular parallelepiped casing 100, a first substrate 101, a second substrate 102, a third substrate 103, and a fourth substrate 104, and the casing 100 stores the first substrate 101, the second substrate 102, the third substrate 103, and the fourth substrate 104. Each of the first substrate 101, the second substrate 102, the third substrate 103, and the fourth substrate 104 is screwed and fixed to the casing 100. Among the first substrate 101, the second substrate 102, the third substrate 103, and the fourth substrate 104, the second substrate 102 is provided at a position closest to a bottom surface of the casing 100. The first substrate 101 is located between the second substrate 102 and the third substrate 103, and the third substrate 103 is located between the first substrate 101 and the fourth substrate 104. The fourth substrate 104 is provided at a position closest to an upper surface of the casing 100.

The wavelength variable filter 20, the light receiving element 21, the photoelectric conversion circuit 22, the amplification circuit 23, the C/V conversion circuit 24, the amplification circuit 25, the voltage step-up conversion circuit 26, and the first processor 30 illustrated in FIG. 3 are provided on the first substrate 101. The plurality of light emitting elements 10 and the light emitting element drive circuit 11 illustrated in FIG. 3 are provided on the second substrate 102. The second processor 40, the power source circuit 41, the switch circuit 42, the charging circuit 43, and the connector 60 illustrated in FIG. 3 are provided on the third substrate 103. The wireless communication module 31, the operation section 32, the light emitting module 33, and the buzzer 34 illustrated in FIG. 3 are provided on the fourth substrate 104.

As illustrated in FIGS. 4, 5 and 6, the display module 50 illustrated in FIG. 3 is located between the fourth substrate 104 and the upper surface of the casing 100, and is visually recognizable from the upper surface of the casing 100. One end of the cable 51 which is coupled to a display driver (not illustrated) built in the display module 50 is coupled to the connector 86 provided on the fourth substrate 104.

As illustrated in FIGS. 4 and 5, both ends of the flexible flat cable 91 are respectively coupled to a connector 81 provided on the first substrate 101 and a connector 87 provided on the fourth substrate 104. Signals that are input and output between the first processor 30 provided on the first substrate 101 and the wireless communication module 31, the operation section 32, the light emitting module 33, and the buzzer 34 provided on the fourth substrate 104 propagate through the flexible flat cable 91.

A display signal output from the first processor 30 provided on the first substrate 101 propagates through the flexible flat cable 91 to reach the fourth substrate 104, and further propagates through the cable 51 to reach the display module 50. Therefore, the fourth substrate 104 functions as a relay substrate that relays the display signal to the display module 50.

Both ends of the flexible flat cable 92 are respectively coupled to a connector 84 provided on the first substrate 101 and a connector 85 provided on the third substrate 103. The first processor 30 provided on the first substrate 101 and the second processor 40 provided on the third substrate 103 perform data communication via the flexible flat cable 92. The voltage V3 based on the voltage V2 generated by the power source circuit 41 provided on the third substrate 103 propagates through the flexible flat cable 92 to reach the first substrate 101, and further propagates through the flexible flat cable 91 to reach the fourth substrate 104. That is, a wiring path from the third substrate 103 to the first substrate 101 is shorter than a wiring path from the third substrate 103 to the fourth substrate 104. Therefore, the amount of drop of the voltage V3 supplied from the power source circuit 41 to the first substrate 101 becomes small, and a stable voltage is supplied to the light receiving element 21 disposed on the first substrate 101.

Both ends of a cable 93 are respectively coupled to a connector 82 provided on the first substrate 101 and a connector 83 provided on the second substrate 102. A control signal output from the first processor 30 provided on the first substrate 101 propagates through the cable 93 to reach the second substrate 102, and is input to the light emitting element drive circuit 11 provided on the second substrate 102.

As illustrated in FIGS. 4 and 5, the battery 70 illustrated in FIG. 3 is located between the first substrate 101, the second substrate 102, the third substrate 103, and the fourth substrate 104. More specifically, the battery 70 is provided between the third substrate 103 and the fourth substrate 104. The third substrate 103 is provided between the battery 70 and the first substrate 101. The battery 70 overlaps the third substrate 103 in a Z axis direction orthogonal to a surface 101F of the first substrate 101. Therefore, the first substrate 101, the second substrate 102, the third substrate 103, the fourth substrate 104, and the battery 70 overlap each other in a plan view viewed from the positive direction of the Z axis. A space in which the first substrate 101, the second substrate 102, and the third substrate 103 are disposed and a space in which the fourth substrate 104 is disposed are separated by the battery 70.

As illustrated in FIG. 4, the battery 70 has a rectangular shape in a plan view viewed from the positive direction of the X axis. On the other hand, as illustrated in FIG. 5, in a plan view viewed from the positive direction of the Y axis, a portion of the battery 70 facing the fourth substrate 104 has a semicircular shape, and d a portion thereof facing the first substrate 101, the second substrate 102, and the third substrate 103 has a trapezoidal shape in which the upper bottom is longer than the lower bottom. Therefore, the portion of the battery 70 facing the first substrate 101, the second substrate 102, and the third substrate 103 has a smaller sectional area as the battery 70 becomes closer to the first substrate 101, the second substrate 102, and the third substrate 103. Thus, a gap is formed between the battery 70 and the third substrate 103 in the X axis direction, and the connectors 71 and 72 are provided on the third substrate 103 by utilizing this gap. The connectors 71 and 72 are coupled to the battery 70 via a wiring (not illustrated). The power source circuit 41 and the charging circuit 43 illustrated in FIG. 3 are electrically coupled to the battery 70 via the connectors 71 and 72.

Figure 7:
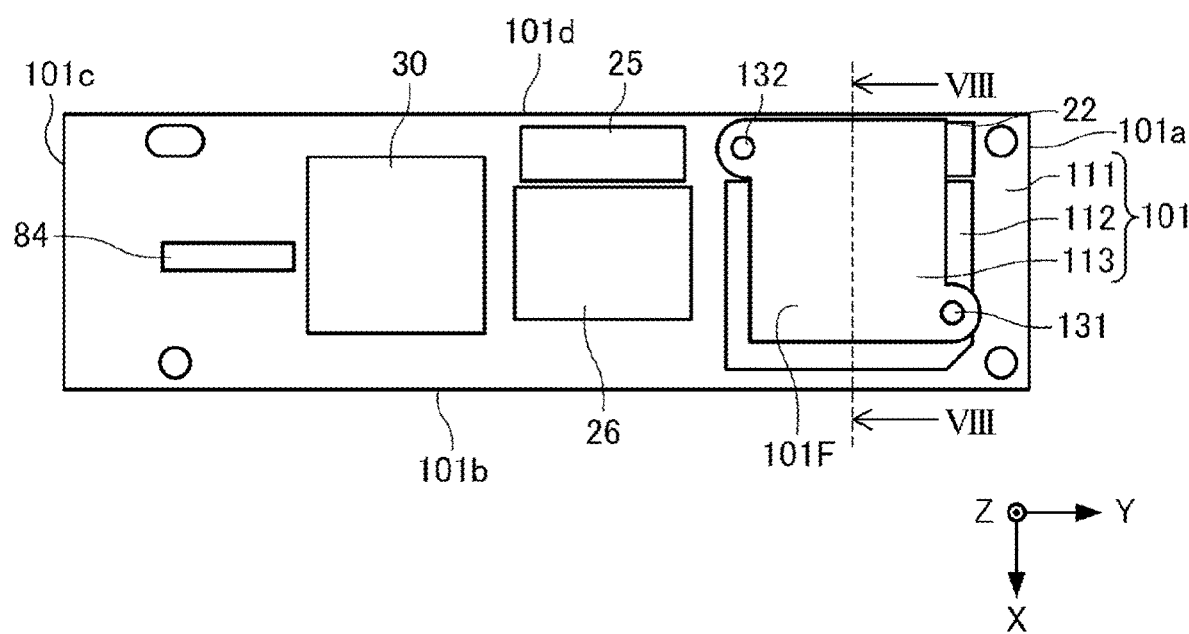
FIG. 7 is a diagram in which a first substrate is viewed from the positive direction of the Z axis.
Figure 8:
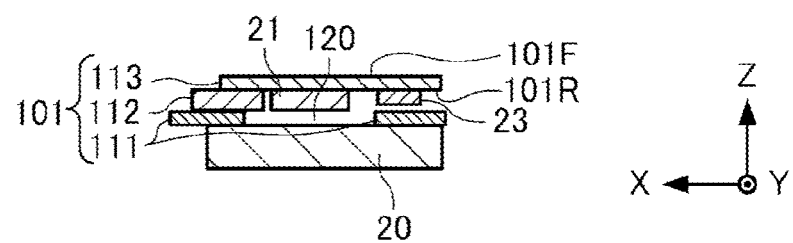
FIG. 8 is a sectional view of the first substrate taken along the line VIII-VIII in FIG. 7.

FIG. 7 is a diagram in which the first substrate 101 is viewed from the positive direction of the Z axis, and FIG. 8 is a sectional view of the first substrate 101 taken along the line VIII-VIII IN FIG. 7. As illustrated in FIG. 7, in a plan view viewed from the positive direction of the Z axis, the first substrate 101 has a rectangular shape having a side 101a, a side 101b longer than the side 101a, a side 101c opposite to the side 101a, and a side 101d opposite to the side 101b.

As illustrated in FIGS. 7 and 8, the first substrate 101 has a surface 101F that faces the positive direction of the Z axis and a surface 101R that faces the negative direction of the Z axis. The first substrate 101 is provided between the third substrate 103 and the second substrate 102 in the Z axis direction. The light receiving element 21 is provided on the surface 101R of the first substrate 101.

As illustrated in FIG. 7, the first substrate 101 is configured by fixing a main substrate 111 and a sub-substrate 113 to a spacer substrate 112 with screws 131 and 132.

Figure 9:
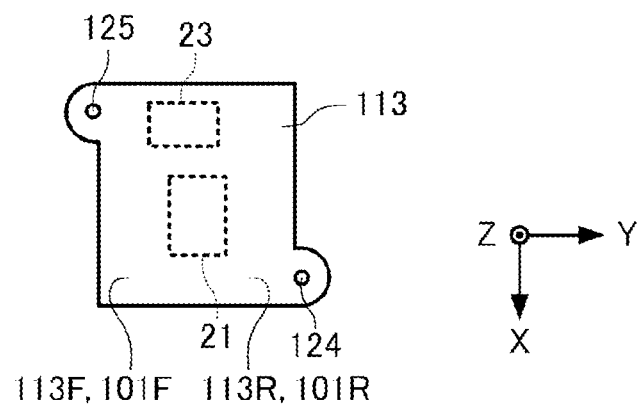
FIG. 9 is a diagram in which a sub-substrate is viewed from the positive direction of the Z axis.
Figure 10:
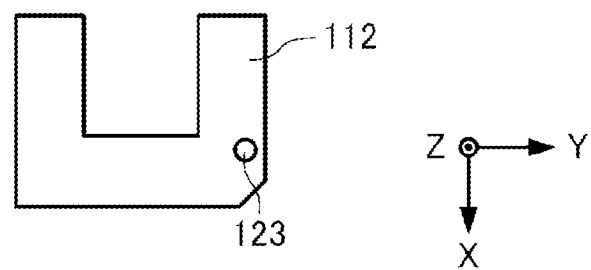
FIG. 10 is a diagram in which a spacer substrate is viewed from the positive direction of the Z axis.
Figure 11:
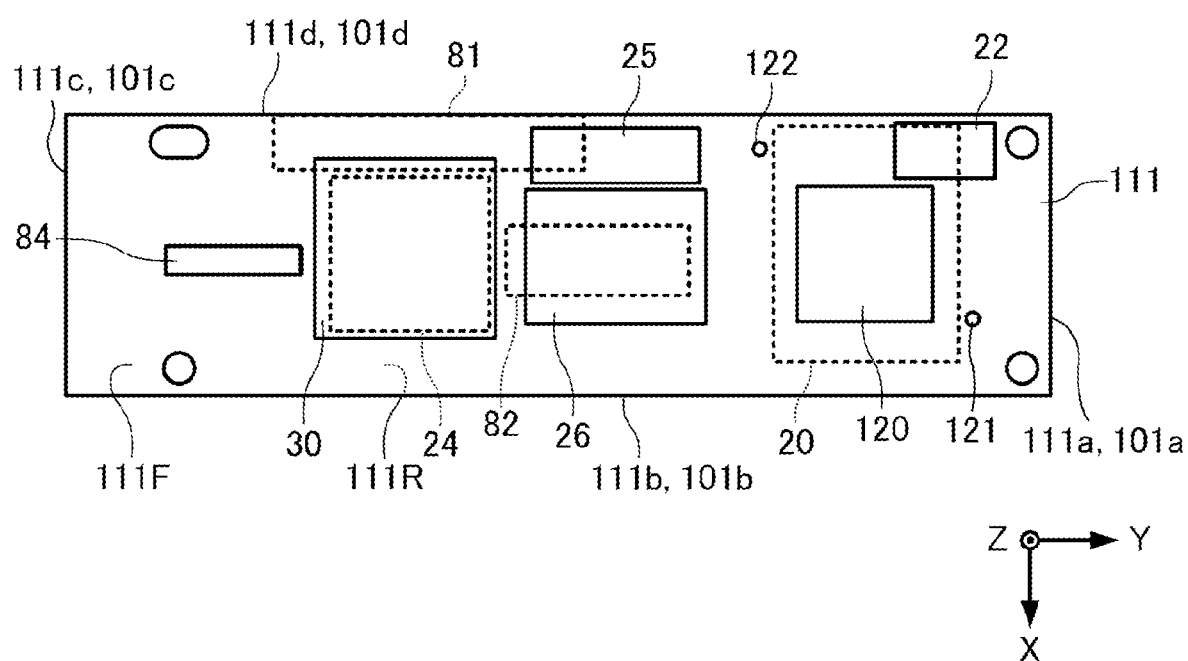
FIG. 11 is a diagram in which a main substrate is viewed from the positive direction of the Z axis.

FIG. 9 is a diagram in which the sub-substrate 113 is viewed from the positive direction of the Z axis. FIG. 10 is a diagram in which the spacer substrate 112 is viewed from the positive direction of the Z axis. FIG. 11 is a diagram in which the main substrate 111 is viewed from the positive direction of the Z axis. In FIGS. 9, 10 and 11, a solid line indicate a constituent provided on the surface of each substrate facing the positive direction of the Z axis, and a dashed line indicates a constituent provided on the surface of each substrate facing the negative direction of the Z axis.

As illustrated in FIGS. 7, 9, 10 and 11, screws 131 are inserted into a screw hole 121 provided in the main substrate 111, a screw hole 123 provided in the spacer substrate 112, and a screw hole 124 provided in the sub-substrate 113, and screws 132 are inserted into a screw hole 122 provided in the main substrate 111 and a screw hole 125 provided in the sub-substrate 113.

As illustrated in FIG. 9, the sub-substrate 113 has a surface 113F that faces the positive direction of the Z axis and a surface 113R that faces the negative direction of the Z axis. The surfaces 101F and 101R of the first substrate 101 are respectively the surfaces 113F and 113R of the sub-substrate 113. As illustrated in FIGS. 8 and 9, the light receiving element 21 and the amplification circuit 23 are provided on the surface 113R of the sub-substrate 113.

As illustrated in FIGS. 7 and 11, in a plan view viewed from the positive direction of the Z axis, an outer shape of the first substrate 101 coincides with an outer shape of the main substrate 111, and the side, 101a, the side 101b, the side 101c, and the side 101d of the first substrate 101 are respectively the side 111a, the side 111b, the side 111c, and the side 111d of the main substrate 111.

As illustrated in FIG. 11, the main substrate 111 has a surface 111F that faces the positive direction of the Z axis and a surface 111R that faces the negative direction of the Z axis. The photoelectric conversion circuit 22, the amplification circuit 25, the voltage step-up conversion circuit 26, the first processor 30, and the connector 84 are provided on the surface 111F of the main substrate 111. The wavelength variable filter 20, the C/V conversion circuit 24, the connector 81, and the connector 82 are provided on the surface 111R of the main substrate 111. As illustrated in FIGS. 8 and 11, the main substrate 111 has a rectangular opening 120, and the wavelength variable filter 20 and the opening 120 overlap each other in a plan view viewed from the positive direction of the Z axis.

In the present embodiment, the first substrate 101 includes three substrates such as the main substrate 111, the spacer substrate 112, and the sub-substrate 113, but may include one or two substrates.

Figure 12:
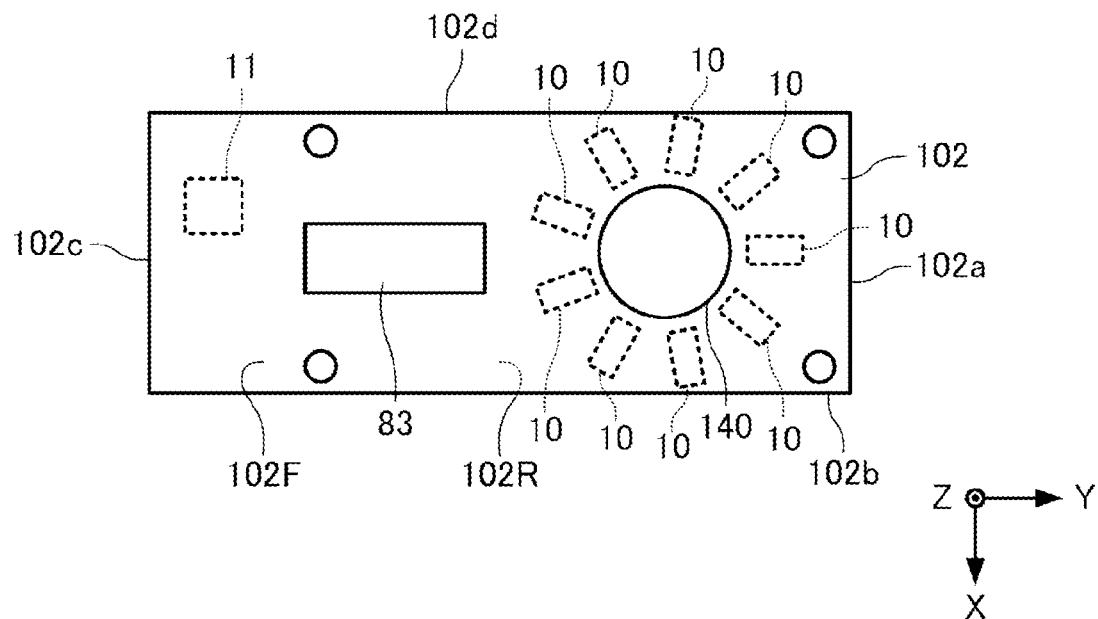
FIG. 12 is a diagram in which the second substrate is viewed from the positive direction of the Z axis.

FIG. 12 is a diagram in which the second substrate 102 is viewed from the positive direction of the Z axis. In FIG. 12, a solid line indicates a constituent provided on the surface 102F of the second substrate 102 facing the positive direction of the Z axis, and a dashed line indicates a constituent provided on the surface 102R of the second substrate 102 facing the negative direction of the Z axis.

As illustrated in FIG. 12, in a plan view viewed from the positive direction of the Z axis, the second substrate 102 has a rectangular shape having a side 102a, a side 102b longer than the side 102a, a side 102c opposite to the side 102a, and a side 102d opposite to the side 102b. The connector 83 is provided on the surface 102F of the second substrate 102. The surface 102F of the second substrate 102 faces the surface 101R of the first substrate 101.

The plurality of light emitting elements 10 and the light emitting element drive circuit 11 are provided on the surface 102R of the second substrate 102. The second substrate 102 has a circular opening 140, and the plurality of light emitting elements 10 are provided on the surface 102R of the second substrate 102 to surround the opening 140 in a plan view viewed from the positive direction of the Z axis. The surface 102R of the second substrate 102 faces the inner wall surface of the casing 100.

Figure 13:
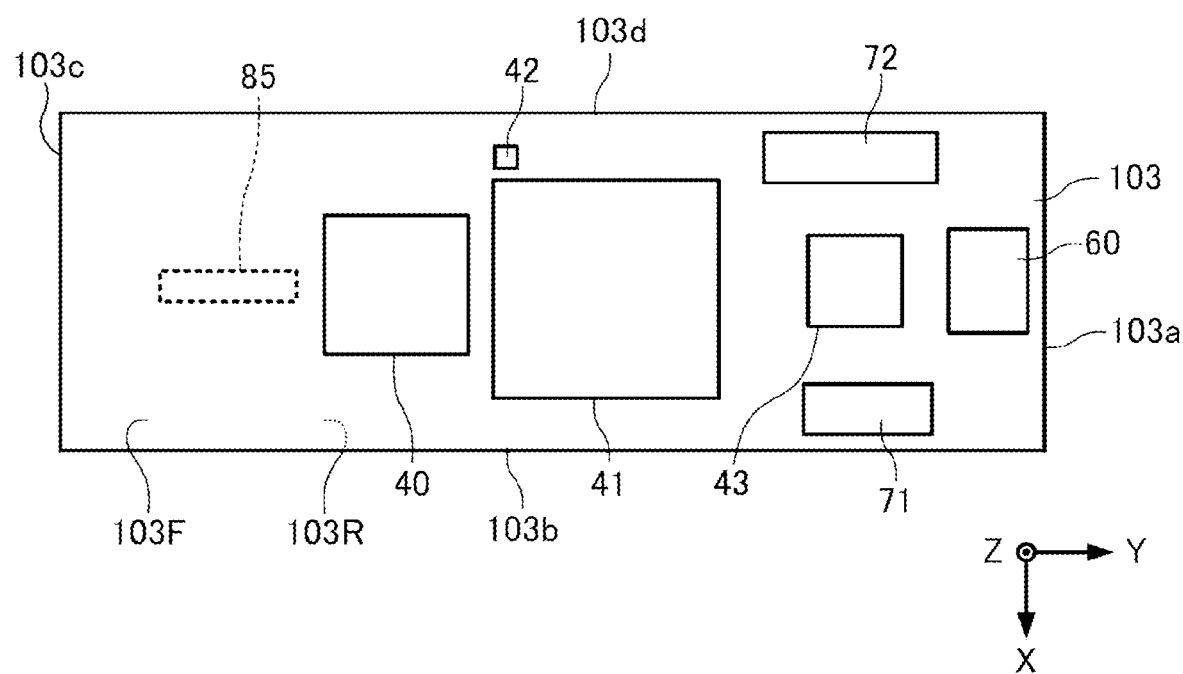
FIG. 13 is a diagram in which a third substrate is viewed from the positive direction of the Z axis.

FIG. 13 is a diagram in which the third substrate 103 is viewed from the positive direction of the Z axis. In FIG. 13, the solid line shows the constituents provided on the surface 103F of the third substrate 103 facing the positive direction of the Z axis, and the dashed line is provided on the surface 103R of the third substrate 103 facing the negative direction of the Z axis. The constituents are illustrated.

As illustrated in FIG. 13, in a plan view viewed from the positive direction of the Z axis, the third substrate 103 has a rectangular shape having a side 103a, a side 103b longer than the side 103a, a side 103c opposite to the side 103a, and a side 103d opposite to the side 103b. The second processor 40, the power source circuit 41, the switch circuit 42, the charging circuit 43, the connector 60, the connector 71, and the connector 72 are provided on the surface 103F of the third substrate 103. The surface 103F of the third substrate 103 faces the battery 70.

The connector 85 is provided on the surface 103R of the third substrate 103. The surface 103R of the third substrate 103 faces the surface 101F of the first substrate 101.

Figure 14:
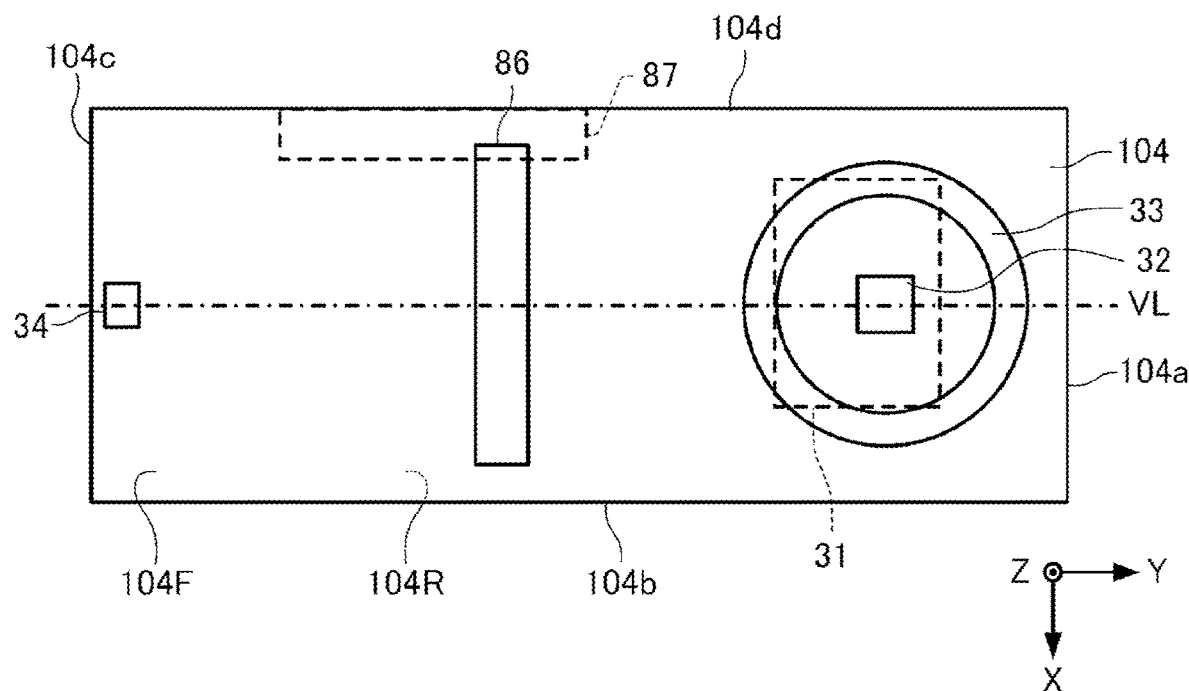
FIG. 14 is a diagram in which the fourth substrate is viewed from the positive direction of the Z axis.

FIG. 14 is a diagram in which the fourth substrate 104 is viewed from the positive direction of the Z axis. In FIG. 14, a solid line indicates a constituent provided on the surface 104F of the fourth substrate 104 facing the positive direction of the Z axis, and a dashed line indicates a constituent provided on the surface 104R of the fourth substrate 104 facing the negative direction of the Z axis.

As illustrated in FIG. 14, in a plan view viewed from the positive direction of the Z axis, the fourth substrate 104 has a rectangular shape having a side 104a, a side 104b longer than the side 104a, a side 104c opposite to the side 104a, and a side 104d opposite to the side 104b. The side 104a is an example of a "first side", the side 104b is an example of a "second side", the side 104c is an example of a "third side", and the side 104d is an example of a "fourth side".

The operation section 32, the light emitting module 33, the buzzer 34, and the connector 86 are provided on the surface 104F of the fourth substrate 104. The operation section 32 is provided on the surface 104F of the fourth substrate 104 at a position overlapping a virtual line VL equidistant from the side 104b and the side 104d. That is, the operation section 32 is disposed at the center of the fourth substrate 104 in the short side direction. The operation section 32 is, for example, a button that is physically displaced when pressed by the user. The operation section 32 may be a capacitance type button.

The surface 104F of the fourth substrate 104 faces the inner wall surface of the casing 100 and the display module 50.

The wireless communication module 31 and the connector 87 are provided on the surface 104R of the fourth substrate 104. The wireless communication module 31 is provided in an end region of the surface 104R of the fourth substrate 104. The end region is a region closest to the side 104a when the entire region of the surface 104R of the fourth substrate 104 is divided into three regions having the same area by two line segments parallel to the side 104a. The surface 104R of the fourth substrate 104 faces the battery 70.

Figure 15:
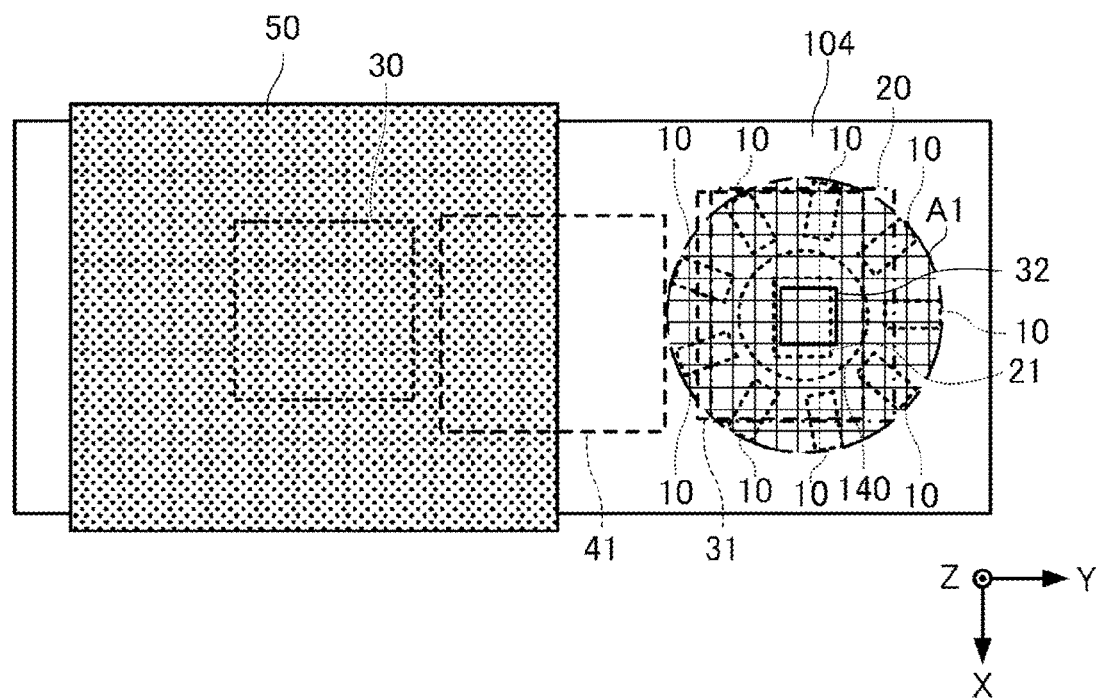
FIG. 15 is a diagram in which some constituents of the image processing device are viewed from the positive direction of the Z axis.

FIG. 15 is a diagram in which the plurality of light emitting elements 10, the wavelength variable filter 20, the light receiving element 21, the opening 140, the first processor 30, the wireless communication module 31, the operation section 32, the power source circuit 41, the display module 50, and the fourth substrate 104 are viewed from the positive direction of the Z axis.

As illustrated in FIG. 15, in the Z axis direction, the opening 140 of the second substrate 102, the wavelength variable filter 20, and the light receiving element 21 overlap each other, and the plurality of light emitting elements 10 are located to surround the opening 140. That is, the opening 140 and the wavelength variable filter 20 overlap on the optical axis of the light receiving element 21, and the plurality of light emitting elements 10 are located to surround the optical axis of the light receiving element 21. Therefore, light emitted from the plurality of light emitting elements 10 is reflected at the image IMG, and the reflected light passes through the opening 140 and is incident to the wavelength variable filter 20. Light having a predetermined wavelength that has transmitted through the wavelength variable filter 20 is incident to the light receiving element 21. The constituents of the optical system are disposed to overlap each other in the Z axis direction in the above-described way, so that a space required for the optical system can be reduced and the casing 100 can be miniaturized.

As illustrated in FIG. 15, the operation section 32 and a region A1 in which the plurality of light emitting elements 10 are disposed are provided at a position where they overlap on the optical axis of the light receiving element 21. Therefore, when the user operates the operation section 32, a force is applied straight to the optical axis of the light receiving element 21, and thus the optical axis of the light receiving element 21 is unlikely to be shaken or shifted with respect to the image IMG. In the present embodiment, since the plurality of light emitting elements 10 are provided on the surface 102R of the second substrate 102 to surround the opening 140, the region A1 is a region of the smallest circle including each disposition region of the plurality of light emitting elements 10.

As illustrated in FIG. 15, the display module 50 and the wireless communication module 31 do not overlap each other in the Z axis direction orthogonal to the surface 101R of the fourth substrate 104 on which the wireless communication module 31 is provided. Therefore, it is possible to reduce concern that the reception sensitivity of the wireless communication module 31 is lowered due to the display module 50.

As illustrated in FIG. 15, the first processor 30 and the light receiving element 21 do not overlap the power source circuit 41 in the Z axis direction. Therefore, it is possible to reduce concern that the characteristics of the light receiving element 21 may change due to heat generated by the power source circuit 41, and to increase the heat dissipation of the power source circuit 41, the first processor 30, and the light receiving element 21, each of which is a heat source.

4. Advantageous Effects

The image processing device 1 of the present embodiment includes the battery 70 and can be carried or operated independently, but in order to solve at least one of various problems caused thereby, various ideas regarding disposition of each constituent have been devised.

One of objects is to reduce concern that a defect may occur due to heat generated in a narrow space inside the small casing 100. In the image processing device 1 of the present embodiment, the light receiving element 21 and the first processor 30 that are operated during an image processing period and may serve as heat generation sources are disposed on the first substrate 101. The plurality of light emitting elements 10 and a light emitting element drive circuit 11 that are operated during the image processing period and may serve as heat generation sources are disposed on the second substrate 102. The power source circuit 41 and the second processor 40 that are operated during the image processing period and may serve as heat generation sources are disposed on the third substrate 103. As described above, in the image processing device 1 of the present embodiment, since the respective constituents that may serve as heat generation sources are provided on the first substrate 101, the second substrate 102, and the third substrate 103 in a distributed manner, mutual thermal influence can be reduced and thus an operation can be stabilized.

Since the power source circuit 41 does not overlap the light receiving element 21 in the Z axis direction, concern that the characteristics of the light receiving element 21 may change due to the heat generated by the power source circuit 41 is reduced, and heat dissipation of each of the power source circuit 41 and the light receiving element 21 is increased. Therefore, according to the image processing device 1, it is possible to reduce concern that the accuracy of image processing performed based on an amount of light received by the light receiving element 21 may be lowered, and thus to continuously perform an operation for a long time while ensuring a constant quality.

According to the image processing device 1, since the first processor 30 that may serve as a heat generation source does not overlap the power source circuit 41 in the Z axis direction, heat dissipation of each of the first processor 30 and the power source circuit 41 is increased.

In the image processing device 1, the wireless communication module 31 is provided on the fourth substrate 104 different from the first substrate 101, the second substrate 102, and the third substrate 103 respectively provided with the light receiving element 21, the plurality of light emitting elements 10, and the power source circuit 41, which may serve as heat generation sources. Therefore, according to the image processing device 1, concern that the wireless communication module 31 required to be stably operated may malfunction due to the influence of heat is reduced.

In the image processing device 1, the battery 70 located between the first substrate 101, the second substrate 102, and the third substrate 103, and the fourth substrate 104 functions as a heat barrier, and thus heat generated from the first substrate 101, the second substrate 102, and the third substrate 103 is unlikely to be transmitted to the fourth substrate 104. Therefore, according to the image processing device 1, the wireless communication module 31 provided on the fourth substrate 104 is unlikely to be influenced by a sudden temperature rise of the first substrate 101, the second substrate 102, and the third substrate 103 due to the image processing, and thus it is possible to ensure a stable communication quality.

As illustrated in FIG. 5, in the image processing device 1, since the portion of the battery 70 facing the first substrate 101, the second substrate 102, and the third substrate 103 have a small sectional area, a gap between the battery 70 and the first substrate 101, the second substrate 102, and the third substrate 103 is larger than when a rectangular parallelepiped battery is disposed. Therefore, according to the image processing device 1, heat from the first substrate 101, the second substrate 102, and the third substrate 103 respectively provided with the light receiving element 21, the plurality of light emitting elements 10, and the power source circuit 41, which may serve as heat generation sources easily diffuses and thus heat dissipation is improved.

The fourth substrate 104 is provided with the wireless communication module 31 and the light emitting module 33 having a small amount of generated heat because they are operated only for a short period of time when necessary, and the operation section 32 and the buzzer 34 that generate almost no heat. Thus, although the fourth substrate 104 generates heat because the fourth substrate 104 relays a display signal to the display module 50 during the image processing period, at least one of the first substrate 101, the second substrate 102, and the third substrate 103 generates a larger amount of heat than the fourth substrate 104. In fact, unless a special situation such as frequent wireless communication occurs, the first substrate 101, the second substrate 102, and the third substrate 103 all generate a larger amount of heat than the fourth substrate 104. As described above, in the image processing device 1, respective constituents having a relatively large amount of generated heat is disposed on the first substrate 101, the second substrate 102, and the third substrate 103 having high heat dissipation, and each constituent having a relatively small amount of generated heat is disposed on the fourth substrate 104 that is unlikely to be influenced by heat. Therefore, according to the image processing device 1, it is possible to improve the heat dissipation while securing the capacity of the battery 70, and thus an operation can be continuously performed for a long time while ensuring a constant quality.

According to the image processing device 1, since the first processor 30 that may serve as a heat generation source is provided on the first substrate 101 having good heat dissipation, an operation can be continuously performed for a long time while ensuring a constant quality.

According to the image processing device 1, since the second processor 40 that may serve as a heat generation source is provided on the third substrate 103 having good heat dissipation, an operation can be continuously performed for a long time while ensuring a constant quality.

One of the objects is also to achieve favorable noise resistance or responsiveness. In the image processing device 1 of the present embodiment, since the first processor 30 that performs image processing is provided on the first substrate 101 provided with the light receiving element 21, a signal output from the light receiving element 21 propagates toward the first processor 30 without passing through the second substrate 102, the third substrate 103, and the fourth substrate 104. Therefore, according to the image processing device 1, it is possible to realize favorable noise resistance or responsiveness.

In the image processing device 1, since the second processor 40 that performs power source control is provided on the third substrate 103 provided with the power source circuit 41, a signal output from the second processor 40 propagates toward the power source circuit 41 without passing through the other substrates. Therefore, according to the image processing device 1, it is possible to realize favorable noise resistance or responsiveness.

According to the image processing device 1, the wireless communication module 31 is disposed in the end region of the fourth substrate 104 in the long side direction in which a distance from the inner wall surface of the casing 100 is small, and is thus unlikely to be influenced by noise such that the communication sensitivity can be increased.

According to the image processing device 1, since the light receiving element 21, the plurality of light emitting elements 10, the power source circuit 41, the wireless communication module 31, and the operation section 32 are respectively provided on different substrates, mutual interference of heat, vibration, signals, and the like is reduced, and thus an operation can be stabilized. Therefore, according to the image processing device 1, it is possible to reduce concern that the accuracy of image processing may be lowered due to mutual interference of heat, vibration, signals, and the like between a plurality of constituents is reduced, and thus to continuously perform an operation for a long time while ensuring a constant quality.

In the image processing device 1, since the wiring path from the third substrate 103 to the first substrate 101 is short, an amount of drop in the voltage V3 supplied from the power source circuit 41 disposed on the third substrate 103 to the first substrate 101 is small. Therefore, according to the image processing device 1, a stable voltage is supplied to the light receiving element 21 disposed on the first substrate 101, and thus concern that the accuracy of image processing may be lowered is reduced.

According to the image processing device 1, since the wiring path between the light receiving element 21 and the photoelectric conversion circuit 22 is short and thus the influence of noise on a minute signal is reduced, concern that the accuracy of image processing may be lowered is reduced.

According to the image processing device 1, since the wireless communication module 31 does not overlap the display module 50 in the direction orthogonal to the fourth substrate 104, concern that the reception sensitivity may be lowered by the display module 50 is reduced.

One of the objects is also to improve user's operability and convenience. In the image processing device 1 of the present embodiment, the first substrate 101 is provided between the third substrate 103 and the second substrate 102 in the Z axis direction, the third substrate 103 is provided between the battery 70 and the first substrate 101, the battery 70 is located between the third substrate 103 and the fourth substrate 104, and the battery 70 overlaps the third substrate 103. Therefore, according to the image processing device 1, the second substrate 102, the first substrate 101, the third substrate 103, the battery 70, and the fourth substrate 104 are disposed to overlap each other in this order, and thus a width of the casing 100 in the X axis direction and the Y axis direction can be made smaller than a height thereof in the Z axis direction. Therefore, a user can easily recognize a position of the light receiving element 21, and thus the operability of the image processing device 1 is improved.

According to the image processing device 1, in the Z axis direction, the opening 140 of the second substrate 102, the wavelength variable filter 20, and the light receiving element 21 overlap each other, and the plurality of light emitting elements 10 are located to surround the opening 140. As a result, a space required for disposing the optical system is reduced such that the casing 100 can be miniaturized.

In the image processing device 1, since the operation section 32 and the buzzer 34 that generate almost no heat and the light emitting module 33 that generates a small amount of heat have almost no effect on the communication quality, the operation section 32, the buzzer 34, and the light emitting module 33 are disposed on the fourth substrate 104 provided with the wireless communication module 31, and thus a region of the fourth substrate 104 is effectively utilized. Since the display module 50 having a smaller amount of generated heat than that of the first substrate 101, the second substrate 102, and the third substrate 103 has the small effect on the communication quality, the fourth substrate 104 on which the wireless communication module 31 is disposed is also used as a relay substrate that relays a display signal to the display module 50. Therefore, according to the image processing device 1, the casing 100 can be miniaturized and a user's operability can be improved.

In the image processing device 1, the operation section 32 provided on the fourth substrate 104, the region A1 of the second substrate 102 on which the plurality of light emitting elements 10 are disposed, and the light receiving element 21 overlap each other on the optical axis of the light receiving element 21. Therefore, when a user operates the operation section 32, a force is applied straight to the optical axis of the light receiving element 21. Therefore, according to the image processing device 1, when the user operates the operation section 32, the optical axis of the light receiving element 21 is unlikely to be shaken or shifted with respect to the image IMG that is a processing target, and a probability that normal data can be acquired is increased.

For example, when the operation section 32 is a button that is physically displaced, since the operation section 32 is physically displaced by a user's operation, it is possible to reliably recognize that the user has performed the operation, and, although a large force is applied by the user's operation, the optical axis of the light receiving element 21 is unlikely to be shaken or shifted.

For example, in a case where the operation section 32 is a capacitance type button, since an operation is detected when a user touches the operation section 32, a force applied by the user's operation is small and the optical axis of the light receiving element 21 is more unlikely to be shaken or shifted.

According to the image processing device 1, since the operation section 32 is disposed at the center of the fourth substrate 104 in the short side direction, it is easy for a user to operate the operation section 32 and the operability is improved. Since the operability is improved, when the user operates the operation section 32, the optical axis of the light receiving element 21 is more unlikely to be shaken or shifted with respect to the image IMG that is a processing target.

According to the image processing device 1, since a user can recognize that the operation section 32 is operated according to a light emitting state of the light emitting module 33 without applying an unnecessarily large force, an amount of shake or shift of the optical axis of the light receiving element 21 is reduced, and thus a probability that normal data can be acquired is improved.

According to the image processing device 1, a user can recognize that an operation failure has occurred based on buzzer sound and can quickly perform an operation of the operation section 32 again, and thus the user's convenience is improved.

According to the image processing device 1, the image processing device 1 can be operated independently without receiving an instruction from another device and can be carried that is thus highly convenient for the user.

One of the objects is also to improve maintainability. In the image processing device 1 of the present embodiment, the light receiving element 21, the plurality of light emitting elements 10, the power source circuit 41, and the wireless communication module 31 and the operation section 32 are respectively provided on different substrates. Therefore, according to the image processing device 1 of the present embodiment, when any one of the light receiving element 21, the plurality of light emitting elements 10, the power source circuit 41, the wireless communication module 31, and the operation section 32 fails, maintainability is good because one substrate needs only be replaced and the other three substrates do not need to be replaced.

According to the image processing device 1, since the light emitting element drive circuit 11 and the plurality of light emitting elements 10 are provided on the second substrate 102, when at least one thereof fails, the second substrate 102 may be replaced with a substrate of which characteristics have been inspected by combining another light emitting element drive circuit and other light emitting elements, and thus maintainability is good.

According to the image processing device 1, since the light receiving element 21 and the photoelectric conversion circuit 22 are provided on the sub-substrate 113 of the first substrate 101, when at least one thereof fails, the sub-substrate 113 of the first substrate 101 may be replaced with a substrate of which characteristics have been inspected by combining another light receiving element and another photoelectric conversion circuit, and thus maintainability is good.

As described above, according to the image processing device 1 of the present embodiment, it is possible to solve at least one of various problems that are likely to occur because the battery 70 is provided and the image processing device 1 can be carried or operated independently.

The present disclosure is not limited to the present embodiment, and various modifications can be made within the scope of the spirit of the present disclosure.

For example, as an image processing device according to the present disclosure, a color measurement device has been described as an example in the above embodiment, but the present disclosure is applicable to various image processing devices having a function of processing an image in addition to the color measurement device. Examples of image processing devices to which the present disclosure is applicable include mobile terminals such as smartphones, portable printers, portable scanners, portable display devices, and digital cameras.

Although the present embodiment or the modification examples have been described above, the present disclosure is not limited to the present embodiment or the modification example, and can be implemented in various aspects without departing from the spirit thereof. For example, each of the embodiments and each of the modification examples may be combined as appropriate.

The present disclosure includes a configuration that is substantially the same as the configuration described in the embodiment, for example, a configuration having the same function, method, and result, or a configuration having the same object and effect. The present disclosure also includes a configuration in which a non-essential part of the configuration described in the embodiment is replaced. The present disclosure also includes a configuration that can achieve the same advantageous effect as that of the configuration described in the embodiment or a configuration that can achieve the same object. The present disclosure includes a configuration in which a well-known technique is added to the configuration described in the embodiment.

The following details are derived from the above-described embodiments and modification examples.

According to one aspect, an image processing device includes a light receiving element; a light emitting element; a battery; a power source circuit electrically coupled to the battery; a wireless communication module; a first substrate provided with the light receiving element; a second substrate provided with the light emitting element; a third substrate provided with the power source circuit; a fourth substrate provided with the wireless communication module; and a casing storing the first substrate, the second substrate, the third substrate, and the fourth substrate, in which the battery is located between the first substrate, the second substrate, and the third substrate, and the fourth substrate.

In this image processing device, the wireless communication module is provided on the fourth substrate different from the first substrate, the second substrate, and the third substrate respectively provided with the light receiving element, the light emitting element, and the power source circuit, which may serve as heat generation sources. The battery located between the first substrate, the second substrate, and the third substrate, and the fourth substrate serves as a heat barrier, and thus heat generated from the first substrate, the second substrate, and the third substrate is unlikely to be transmitted to the fourth substrate. Therefore, according to this image processing device, the wireless communication module provided on the fourth substrate is unlikely to be influenced by a sudden temperature rise of the first substrate, the second substrate, and the third substrate due to the image processing such that concern that a defect may occur is reduced, and thus it is possible to ensure a stable communication quality.

According to the aspect, the image processing device may further include an operation section, in which the operation section may be provided on the fourth substrate.

In this image processing device, since the operation section that generates almost no heat has no effect on the communication quality, the operation section is disposed on the fourth substrate provided with the wireless communication module, and thus a region of the fourth substrate is effectively utilized. Therefore, according to this image processing device, it is possible to miniaturize the casing and thus to improve a user's operability.

In the aspect of the image processing device, the fourth substrate may have a first side, a second side longer than the first side, a third side opposite to the first side, and a fourth side opposite to the second side, and the operation section may be provided at a position overlapping a virtual line equidistant from the second side and the fourth side.

According to this image processing device, since the operation section is disposed at the center of the fourth substrate in the short side direction, it is easy for a user to operate the operation section and the operability is improved.

In the aspect of the image processing device, the fourth substrate may have a first side, a second side longer than the first side, a third side opposite to the first side, and a fourth side opposite to the second side, and the wireless communication module may be provided in an end region closer to the first side than the third side.

According to this image processing device, the wireless communication module is disposed in the end region of the fourth substrate in the long side direction in which a distance from the wall surface of the casing is small, and is thus unlikely to be influenced by noise such that the communication sensitivity can be increased.

According to the aspect, the image processing device may further include a buzzer, in which the buzzer may be provided on the fourth substrate.

In this image processing device, since the buzzer that generates almost no heat has no effect on the communication quality, the buzzer is disposed on the fourth substrate provided with the wireless communication module, and thus a region of the fourth substrate is effectively utilized. Therefore, according to this image processing device, it is possible to miniaturize the casing and thus to improve a user's operability.

According to the aspect, the image processing device may further include a display module, in which the fourth substrate may function as a relay substrate that relays a display signal to the display module.

In the image processing device, since the display module having a smaller amount of generated heat than that of the first substrate, the second substrate, and the third substrate has the small effect on the communication quality, the fourth substrate on which the wireless communication module is disposed is also used as a relay substrate. Therefore, according to this image processing device, it is possible to miniaturize the casing and thus to improve a user's operability.

In the aspect of the image processing device, a light emitting module for status display, in which the light emitting module may be provided on the fourth substrate.

In this image processing device, since the light emitting module for status display that generates a small amount of heat have almost no effect on the communication quality, the light emitting module is disposed on the fourth substrate provided with the wireless communication module, and thus a region of the fourth substrate is effectively utilized. Therefore, according to this image processing device, it is possible to miniaturize the casing and thus to improve a user's operability.

What is claimed is:

1. An image processing device comprising:
    a light receiving element;
    a light emitting element;
    a battery;
    a power source circuit electrically coupled to the battery;
    a wireless communication module;
    a first substrate provided with the light receiving element;
    a second substrate provided with the light emitting element;
    a third substrate provided with the power source circuit;
    a fourth substrate provided with the wireless communication module; and
    a casing storing the first substrate, the second substrate, the third substrate, and the fourth substrate, wherein
    the battery is located between the first substrate, the second substrate, and the third substrate, and the fourth substrate.

2. The image processing device according to claim 1, further comprising:
    an operation section, wherein
    the operation section is provided on the fourth substrate.

3. The image processing device according to claim 2, wherein
    the fourth substrate has a first side, a second side longer than the first side, a third side opposite to the first side, and a fourth side opposite to the second side, and
    the operation section is provided at a position overlapping a virtual line equidistant from the second side and the fourth side.

4. The image processing device according to claim 1, wherein
   the fourth substrate has a first side, a second side longer than the first side, a third side opposite to the first side, and a fourth side opposite to the second side, and
   the wireless communication module is provided in an end region closer to the first side than the third side.

5. The image processing device according to claim 1, further comprising:
   a buzzer, wherein
   the buzzer is provided on the fourth substrate.

6. The image processing device according to claim 1, further comprising:
   a display module, wherein
   the fourth substrate functions as a relay substrate that relays a display signal to the display module.

7. The image processing device according to claim 1, further comprising:
   a light emitting module for status display, wherein
   the light emitting module is provided on the fourth substrate.

\* \* \* \* \*